(12) United States Patent
Shen et al.

(10) Patent No.: US 12,375,110 B1
(45) Date of Patent: Jul. 29, 2025

(54) ETHERNET PHYSICAL LAYER TRANSCEIVER WITH GRACEFUL TEMPERATURE PROTECTION

(71) Applicant: Marvell Asia Pte Ltd, Singapore (SG)

(72) Inventors: David Shen, Saratoga, CA (US); Seid Alireza Razavi Majomard, Belmont, CA (US)

(73) Assignee: Marvell Asia Pte Ltd, Singapore (SG)

( * ) Notice: Subject to any disclaimer, the term of this patent is extended or adjusted under 35 U.S.C. 154(b) by 506 days.

(21) Appl. No.: 17/948,265

(22) Filed: Sep. 20, 2022

Related U.S. Application Data

(60) Provisional application No. 63/250,194, filed on Sep. 29, 2021.

(51) Int. Cl.
*H04B 1/38* (2015.01)
*H04B 1/036* (2006.01)
*H04Q 1/02* (2006.01)
*H05K 7/20* (2006.01)
*H04L 5/14* (2006.01)

(52) U.S. Cl.
CPC ............ *H04B 1/036* (2013.01); *H04Q 1/035* (2013.01); *H05K 7/20281* (2013.01); *H04L 5/14* (2013.01)

(58) Field of Classification Search
CPC .... H04B 1/036; H04Q 1/035; H05K 7/20281; H04L 5/14
USPC ......................................................... 455/561
See application file for complete search history.

(56) References Cited

U.S. PATENT DOCUMENTS

| | | | | |
|---|---|---|---|---|
| 4,177,376 A | * | 12/1979 | Horsma | H05B 3/06 219/505 |
| 4,246,468 A | * | 1/1981 | Horsma | H01C 7/027 264/105 |
| 4,361,799 A | * | 11/1982 | Lutz | G01K 3/00 219/505 |
| 6,055,145 A | * | 4/2000 | Lagree | H02H 3/04 361/115 |
| 6,819,710 B1 | * | 11/2004 | Dupuis | H04L 25/0266 375/220 |
| 6,847,614 B2 | * | 1/2005 | Banker | H04L 45/04 370/255 |
| 7,523,803 B2 | * | 4/2009 | Breed | B60N 2/0031 297/217.3 |
| 7,660,437 B2 | * | 2/2010 | Breed | G06V 20/59 382/104 |

(Continued)

OTHER PUBLICATIONS

IEEE Std. 802.3ch-2020, "IEEE Standard for Ethernet, Amendment 8: Physical Layer Specifications and Management Parameters for 2.5 GB/s, 5 GB/s, and 10 GB/s Automotive Electrical Ethernet", pp. 1-207, year 2020.

*Primary Examiner* — Amancio Gonzalez
(74) *Attorney, Agent, or Firm* — Meitar Patents Ltd.; Daniel Kligler

(57) ABSTRACT

A Physical Layer (PHY) transceiver includes communication circuitry and a controller. The communication circuitry includes a digital filter, and is configured to communicate signals using the digital filter over a network link. The controller is configured to monitor a temperature pertaining to the communication circuitry, and, in response to detecting an actual or predicted over-temperature condition, to degrade a functionality of the digital filter so as to reduce power dissipation in the communication circuitry.

20 Claims, 3 Drawing Sheets

(56) References Cited

U.S. PATENT DOCUMENTS

| | | | | |
|---|---|---|---|---|
| 7,835,389 | B2* | 11/2010 | Yu | H04L 25/4923 |
| | | | | 341/51 |
| 7,949,529 | B2* | 5/2011 | Weider | G10L 15/22 |
| | | | | 715/728 |
| 8,054,203 | B2* | 11/2011 | Breed | B60R 25/252 |
| | | | | 340/552 |
| 8,437,366 | B2* | 5/2013 | Ungerboeck | H04L 12/403 |
| | | | | 370/464 |
| 8,577,048 | B2* | 11/2013 | Chaikin | H04R 29/001 |
| | | | | 381/103 |
| 8,654,636 | B2* | 2/2014 | Conway | H04L 5/1446 |
| | | | | 370/230.1 |
| 8,677,920 | B1* | 3/2014 | Jeng | B63B 3/08 |
| | | | | 114/77 R |
| 8,824,973 | B2* | 9/2014 | Kleinhenz | H04B 17/26 |
| | | | | 455/67.11 |
| 8,867,564 | B2* | 10/2014 | Powell | H04L 5/1438 |
| | | | | 370/465 |
| 8,938,366 | B2* | 1/2015 | Nielsen | G01V 3/38 |
| | | | | 702/130 |
| 9,876,377 | B2* | 1/2018 | Imaizumi | H01M 10/425 |
| 10,003,205 | B2* | 6/2018 | Kaji | H02J 7/00306 |
| 10,074,580 | B2* | 9/2018 | Onabajo | G06F 21/552 |
| 10,514,747 | B2* | 12/2019 | Fernald | G06F 1/3234 |
| 10,930,575 | B2* | 2/2021 | Subrahmanyam | |
| | | | | H05K 7/20445 |
| 10,973,154 | B2* | 4/2021 | Chao | H01L 23/473 |
| 11,375,980 | B2* | 7/2022 | Chen | G01S 7/52079 |
| 2005/0025496 | A1* | 2/2005 | Akita | H04B 10/299 |
| | | | | 398/140 |
| 2007/0115846 | A1* | 5/2007 | Kooyers | H04L 43/0847 |
| | | | | 370/465 |
| 2007/0280388 | A1* | 12/2007 | Torre | H04L 25/03057 |
| | | | | 370/291 |
| 2012/0050000 | A1* | 3/2012 | Melvin, Jr. | G05B 23/0289 |
| | | | | 340/3.1 |
| 2013/0343107 | A1* | 12/2013 | Perreault | H03F 3/211 |
| | | | | 363/67 |
| 2015/0241285 | A1* | 8/2015 | Schneider | G01K 1/143 |
| | | | | 374/208 |
| 2015/0326348 | A1* | 11/2015 | Shen | H04L 1/0041 |
| | | | | 714/776 |
| 2016/0352419 | A1* | 12/2016 | Fonseka | H04L 1/0065 |
| 2018/0321735 | A1* | 11/2018 | Luo | G06F 1/206 |
| 2020/0106535 | A1* | 4/2020 | Bandi | H04B 17/104 |
| 2021/0080982 | A1* | 3/2021 | Mehta | G06F 11/3062 |
| 2021/0183832 | A1* | 6/2021 | Chen | H01L 24/19 |
| 2021/0215541 | A1* | 7/2021 | Coliukos | G01R 31/309 |
| 2021/0399927 | A1 | 12/2021 | Razavi et al. | |
| 2022/0131724 | A1 | 4/2022 | Razavi et al. | |
| 2022/0329220 | A1* | 10/2022 | Chini | H04L 25/0288 |
| 2022/0345152 | A1* | 10/2022 | Elkholy | H03L 7/0991 |
| 2023/0099531 | A1* | 3/2023 | Tadele | G01K 7/02 |
| | | | | 374/30 |
| 2024/0024565 | A1* | 1/2024 | Laitenberger | A61M 1/962 |

* cited by examiner

ETHERNET PHYSICAL LAYER TRANSCEIVER WITH GRACEFUL TEMPERATURE PROTECTION

CROSS-REFERENCE TO RELATED APPLICATIONS

This application claims the benefit of U.S. Provisional Patent Application 63/250,194, filed Sep. 29, 2021, whose disclosure is incorporated herein by reference.

FIELD OF THE DISCLOSURE

The present disclosure relates generally to network communication, and particularly to operation of digital filters in Physical Layer (PHY) transceivers.

BACKGROUND

Communication transceivers commonly process signals using adaptive digital filters such as equalizers, echo cancelers, crosstalk cancelers and correlators. Various techniques for adaptation of digital filters in communication transceivers are known in the art.

For example, U.S. Patent Application Publication 2022/0131724 describes a physical layer (PHY) transceiver for connecting a host device to a wireline channel medium that is divided into a total number of link segments. The PHY transceiver includes feed-forward equalization (FFE) circuitry, Respective individual filter segments are selectably configurable, by adjustment of respective delay lines, to correspond to respective individual link segments.

U.S. Patent Application Publication 2021/0399927 describes another PHY transceiver, which includes filter circuitry including a plurality of filter segments. Individual filter segments are configurable to correspond to individual link segments, and are separately controllable from other filter segments. Control circuitry detects a change of transmission conditions in a particular link segment, and changes a configuration of one of the plurality of filter segments to cause an alteration in filtering of signals in the particular link segment at which the change of transmission conditions is detected.

The description above is presented as a general overview of related art in this field and should not be construed as an admission that any of the information it contains constitutes prior art against the present patent application.

SUMMARY

An embodiment that is described herein provides a Physical Layer (PHY) transceiver including communication circuitry and a controller. The communication circuitry includes a digital filter, and is configured to communicate signals using the digital filter over a network link. The controller is configured to monitor a temperature pertaining to the communication circuitry, and, in response to detecting an actual or predicted over-temperature condition, to degrade a functionality of the digital filter so as to reduce power dissipation in the communication circuitry.

In some embodiments the digital filter is adaptive, and the controller is configured to degrade the functionality by freezing or slowing-down adaptation of the digital filter. In some embodiments the digital filter includes a plurality of taps, and the controller is configured to degrade the functionality by zeroing one or more of the taps. In some embodiments the digital filter is divided into two or more filter segments, and the controller is configured to degrade the functionality by deactivating one or more of the filter segments.

In an embodiment, the controller is further configured to reduce the power dissipation by reducing a clock speed of at least part of the communication circuitry. In a disclosed embodiment, the communication circuitry further includes an Error Correction Code (ECC) decoder, and the controller is further configured to reduce the power dissipation by degrading the functionality of the ECC decoder. In an embodiment, the communication circuitry further includes an analog front end (AFE), and the controller is further configured to reduce the power dissipation by limiting a power provided to the AFE.

In some embodiments, the controller is configured to detect an actual or predicted over-temperature condition, by detecting that the monitored temperature exceeds or is expected to exceed a temperature threshold. In some embodiments, the controller is configured to detect the actual predicted over-temperature or condition, by detecting that the monitored temperature exceeds or will exceed a temperature threshold at a future point in time.

In an example embodiment, the controller is configured to detect the predicted over-temperature condition, by calculating a slope of the temperature, and predicting, based on the monitored temperature and the calculated temperature slope, that the over-temperature condition will occur at a future point in time. In another embodiment, the controller is configured to detect the predicted over-temperature condition, by monitoring the temperature at a plurality of points in time, and predicting that the temperature will exceed a temperature threshold at a future point in time.

In a disclosed embodiment, the controller is configured to detect the predicted over-temperature condition by applying a Machine Learning (ML) model at least to the monitored temperature. In another embodiment, the controller is configured to detect the actual or predicted over-temperature condition, by evaluating that an over-heating threshold has been exceeded or forecasting, based on a history of temperature measurements, that an overheating threshold will be exceeded.

In yet another embodiment, the controller is configured to revert back to normal functionality of the digital filter upon detecting that the communication circuitry meets a temperature-renormalization condition. In still another embodiment, in response to violation of the over-temperature condition, the controller is configured to issue a warning indicating that t the functionality of the digital filter is degraded. In some embodiments, the PHY transceiver is part of communication network in a vehicle, and the controller is configured to degrade the functionality based on an expected impact of the degraded functionality on safety of the vehicle.

There is additionally provided, in accordance with an embodiment that is described herein, a method for operating a Physical Layer (PHY) transceiver that includes a digital filter. The method includes communicating signals using the digital filter over a network link, and monitoring a temperature pertaining to the PHY transceiver. In response to detecting an actual or predicted over-temperature condition, a functionality of the digital filter is degraded so as to reduce power dissipation in the PHY transceiver.

The present disclosure will be more fully understood from the following detailed description of the embodiments thereof, taken together with the drawings in which:

DETAILED DESCRIPTION OF EMBODIMENTS

In various systems and applications, Physical Layer (PHY) transceivers are required to operate under harsh environmental conditions, and at the same time to exhibit high reliability and availability. For example, Ethernet PHY transceivers used in In-Vehicle Networks (IVNs) are required to withstand high ambient temperatures on the order of 125° C., and under these conditions achieve a useful lifetime of 10-20 years over 60-70 Million vehicles per year. In IVNs, availability and reliability of communication devices have a direct impact on driver safety, and are therefore of utmost importance.

A PHY transceiver typically comprises various semiconductor devices for which maximum junction temperatures are specified. Exceeding the maximum junction temperature of a semiconductor device can result in performance degradation, reliability degradation or even failure.

Embodiments that are described herein provide improved techniques for detecting actual or predicted violations of temperature conditions in PHY transceivers, and for reacting to such actual predicted violations.

In a nutshell, the disclosed techniques exploit the fact that the PHY transceiver comprises one or more digital filters, such as an equalizer, echo canceler, one or more near-end crosstalk (NEXT) cancelers and/or one or more far-end crosstalk (FEXT) cancelers. In many practical implementations, the digital filters and their associated logic are major contributors to the overall power consumption of the PHY transceiver. In some embodiments, upon detecting an actual or predicted over-temperature condition, the PHY transceiver degrades the functionality of one or more of the digital filters in a way that reduces power dissipation. As a result, self-heating of the PHY transceiver is reduced.

When using the disclosed techniques, over-temperature conditions may be resolved while keeping the PHY transceiver operational, albeit at reduced performance, instead of shutting down the PHY transceiver altogether. The disclosed techniques thus provide graceful degradation at high temperatures, improving the availability of the PHY transceiver. Moreover, the disclosed techniques enable trading between functionality and power consumption without having to modify clock rates in the PHY transceiver. Reducing power consumption by reducing clock rates is a problematic solution in automotive applications, as it may have safety implications.

Various techniques trading between for functionality and power consumption of a digital filter are described below. Any of these techniques can be used for mitigating over-temperature. Various techniques for detecting actual or predicted over-temperature conditions are also described. The example embodiments disclosed herein are described in the context of an automotive Ethernet network. The disclosed techniques, however, are generally applicable in various other environments and network types.

Figure 1:
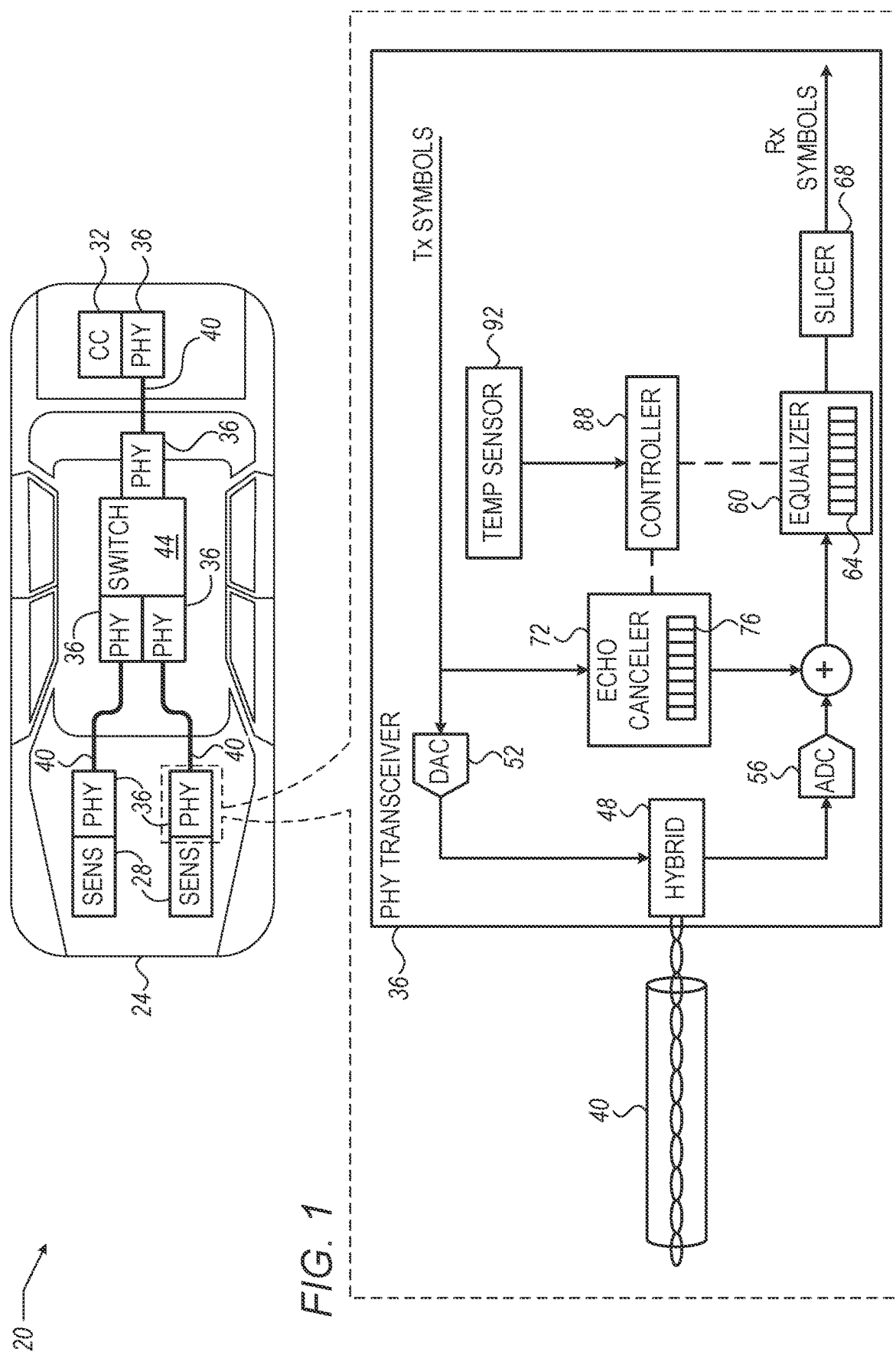
FIG. 1 is a block diagram that schematically illustrates an automotive full-duplex Ethernet communication system, in accordance with an embodiment that is described herein.

FIG. 1 is a block diagram that schematically illustrates an automotive Ethernet communication system 20, in accordance with an embodiment that is described herein. In the embodiment described, system 20 is installed in a vehicle 24, and comprises multiple sensors 28 that communicate with a central computer (CC) 32. In other embodiments (not seen), system 20 may be installed in an industrial network or other suitable network. In various embodiments, sensors May 28 comprise any suitable types of sensors. Several non-limiting examples of sensors comprise video cameras, velocity sensors, accelerometers, audio sensors, infra-red sensors, radar sensors, lidar sensors, ultrasonic sensors, rangefinders or other proximity sensors, and the like.

Sensors 28 and CC 32 communicate via an Ethernet network comprising multiple Ethernet PHY transceivers 36, multiple network links 40 and an Ethernet switch 44. Elements such as Medium Access Control (MAC) devices are not shown in the figure for the sake of clarity. In the present example, PHY transceiver 36 of each sensor 28 is connected by a network link 40 to a peer PHY transceiver 36 coupled to a port of switch 44. CC 32 is also connected to a port of switch 44 in a similar manner, via a network link 40 and a pair of PHY transceivers 36. Ethernet links 40 are full-duplex links, e.g., twisted-pair cables.

In various embodiments, PHY transceivers 36 of system 20 may communicate over network links 40 at any suitable bit rate. Example bit rates are 2.5 Gb/s, 5 Gb/s or 10 Gb/s, in accordance with the IEEE 802.3ch-2020 standard.

An inset at the bottom of FIG. 1 focuses on one of PHY transceivers 36, which communicate over a twisted-pair link 40, by way of example. The other PHY transceivers 36 typically have a similar internal structure.

In the present example, PHY transceiver 36 comprises a hybrid combiner 48 that serves as a bidirectional interface to cable 40. The transmitter (TX) of PHY transceiver 36 comprises a Digital-to-Analog Converter (DAC) 56, The receiver (RX) of PHY transceiver 36 comprises an Analog-to-Digital Converter (ADC) 56, an adaptive equalizer 60 and a slicer 68, Transmitter and receiver components that are not mandatory for understanding of the disclosed techniques have been omitted from the figure for the sake of clarity.

On transmission, a sequence of transmit (TX) symbols (also referred to as a digital TX signal) is provided to DAC 52. DAC 52 converts the digital TX signal into an analog TX signal for transmission. The analog TX signal is transmitted via hybrid 48 on cable 40 to a peer PHY transceiver. On reception, an analog receive (RX) signal is received from the peer PHY transceiver, on cable 40 via hybrid 48. ADC 56 digitizes the analog RX signal, i.e., converts the analog RX signal into a digital RX signal. Equalizer 60 filters the digital RX signal so as to compensate for the channel response of cable 40. Slicer 68 extracts and outputs a sequence of RX symbols.

PHY transceiver 36 further comprises an echo canceler 72. In some embodiments, cable 40 comprises multiple wire pairs, and PHY transceiver 36 further comprises one or more crosstalk cancelers (not seen in the figure), e.g., one or more FEXT cancelers and/or one or more NEXT cancelers. PHY transceiver 36 further comprises a controller 88 and a temperature sensor 92.

In some embodiments, PHY transceiver 36 comprises communication circuitry comprising multiple digital filters. In the example of FIG. 1, equalizer 60 comprises a digital filter 64 having plural filter taps, and echo canceler 72 comprises a digital filter 76 having plural filter taps. When the PHY transceiver comprises one or more crosstalk (NEXT or FEXT) canceler, each crosstalk canceler typically comprises a respective digital filter, as well, having plural filter taps. Additionally, or alternatively, PHY transceiver 36 may comprise any other suitable type of digital filters, for example a correlator as described in U.S. Patent Application Publications 2021/0399927 and 2022/0131724, cited above, whose disclosures are incorporated herein by reference.

The digital filters in PHY transceiver 36 typically comprise Finite Impulse Response (FIR) filters having programmable coefficients (taps). Typically, the various taps of the various digital filters are programmed and adapted by controller 88. In addition to adapting the taps of the digital filters (e.g., for equalization, or echo or crosstalk cancellation), in some embodiments controller 88 is also configured to reduce the functionality of one or more of the digital filters of PHY transceiver 36, in response to an actual or predicted over-temperature condition pertaining to the communication circuitry. By degrading filter functionality, self heating caused by the filter is reduced. Therefore, reducing the functionality of digital filters enables resolving of over-temperature conditions without to having shut down the PHY transceiver completely and/or to reduce clock speed, which as noted above have safety implications.

Upon detecting an actual or predicted over-temperature condition, controller 88 may degrade the functionality of any of the digital filters in the PHY transceiver 36 (e.g., filter 64, 76 and/or a filter in a crosstalk canceler) in order to reduce power consumption and thus power dissipation.

A given digital filter may be reconfigured for reduced performance and reduced power consumption/dissipation in various ways. In one example embodiment, controller 88 degrades the functionality of an adaptive digital filter by freezing the adaptation of the filter, i.e., by freezing the coefficients (taps) of the filter at their current values. In another embodiment, controller 88 degrades the functionality of a digital filter by slowing down the rate of adaptation, e.g., by setting a longer period between successive adaptation of the filter taps. In yet another embodiment, controller 88 degrades the functionality of a digital filter by nulling (i.e., zeroing, setting to zero) one or more of the filter taps.

In another embodiment, a given digital filter is divided into a plurality of filter segments, each segment comprising one or more taps. Examples of such filters can be found in U.S. Patent Application Publications 2021/0399927 and 2022/0131724, cited above, whose disclosures are incorporated herein by reference. In an embodiment, controller 88 may degrade the functionality of such a digital filter by deactivating (e.g., shutting the power supply to) one or more of the filter segments. Further additionally or alternatively, controller 88 may degrade the functionality of a digital filter in PHY transceiver 36, in return for reduced power dissipation, in any other suitable way.

Depending on the choice of filter to be degraded, different trade-offs can be set between performance and temperature. For example, degrading filter 64 may result in poorer Signal-to-Noise Ratio (SNR) due to reduced-accuracy equalization, Degrading filter 76 may result in poorer echo cancellation, and therefore higher interference level in the received signal.

In some embodiments, upon detecting an actual or predicted over-temperature condition, controller 88 degrades the overall PHY transceiver performance gradually, starting with a mild degradation of a filter that causes only slight reduction in performance. If the persists, controller 88 over-temperature condition reverts to more severe degradations. The escalation in severity of degradation may involve one or more of the following:

Advancing from filters having mild effect on performance to filters having higher effect on performance.
Progressively degrading a larger number of filters,
For a given filter, applying measures that gradually degrade the filter performance in return for lower power consumption. For example, freezing adaptation of filter 64 (of equalizer 60) may be unnoticeable over the short term, but on the other hand provides only slight reduction in power consumption. At the other extreme, shutting off the power to some of the filter segments will reduce power considerably, but will also reduce equalization performance considerably.

In some embodiments, as part of a process of gradually reducing the performance of PHY transceiver 36 in return for reduced temperature, controller 88 may apply additional measures such as one or more of the following:

Reducing clock speed of at least part of the communication circuitry, e.g., of a digital filter or of controller 88 itself.
Reducing the rate or extent of error correction in an Error Correction Code (ECC) decoder in the PHY transceiver, or otherwise degrading the performance of the ECC decoder.
Limiting the power provided to an analog front end (AFE) of the PHY transceiver.

In some embodiments, controller 88 chooses different temperature reduction measures for different components of PHY device 36 (e.g., certain measures for an equalizer and other measures for an echo canceler). Additionally or alternatively, controller 88 may choose a temperature reduction measure for a certain component or for the entire PHY transceiver based on the expected impact of the selected measure on vehicle safety (i.e., the safety impact of the degraded performance caused by the selected temperature-reduction measure). If and when over-temperature becomes (or is expected to become) more severe, controller 88 may apply measures that progressively increase in their adverse effect on safety, possibly up to the point of having to shut down the PHY transceiver. In other network types, factors other than safety may be considered in choosing temperature reduction measures that affect the performance of the PHY transceiver.

The configurations of system 20 and of PHY transceiver 36, as shown in FIG. 1, are example configurations that are depicted solely for the sake of clarity. In alternative embodiments, any other suitable configurations can be used. In the context of the present disclosure and in the claims, the various components of PHY transceiver 36, excluding controller 88, are referred to collectively as "communication circuitry". In alternative embodiments, the communication circuitry of PHY transceiver 36 may comprise any other suitable components. Various other components of the communication circuitry may comprise digital filters, e.g., correlators or any other suitable type of filter, and any such digital filter may be subjected to the disclosed techniques.

The different elements of PHY transceiver 36 may be implemented using dedicated hardware or firmware, such as using hard-wired or programmable logic, e.g., in an Application-Specific Integrated Circuit (ASIC) or Field-Programmable Gate Array (FPGA). Additionally, or alternatively, some functions of PHY transceiver 36 may be implemented in software and/or using a combination of hardware and software elements. Elements that are not mandatory for understanding of the disclosed techniques have been omitted from the figure for the sake of clarity.

In some embodiments, some functions of the disclosed PHY transceivers, e.g. f functions of controller 88, may be implemented in one or more programmable processors, e.g., one or more Central Processing Units (CPUs), microcontroller and/or Digital Signal Processors (DSPs), which are programmed in software to carry out the functions described herein. The software may be downloaded to any of the processors in electronic form, over a network, for example, or it may, alternatively or additionally, be provided and/or stored on non-transitory tangible media, such as magnetic, optical, or electronic memory.

Figure 2:
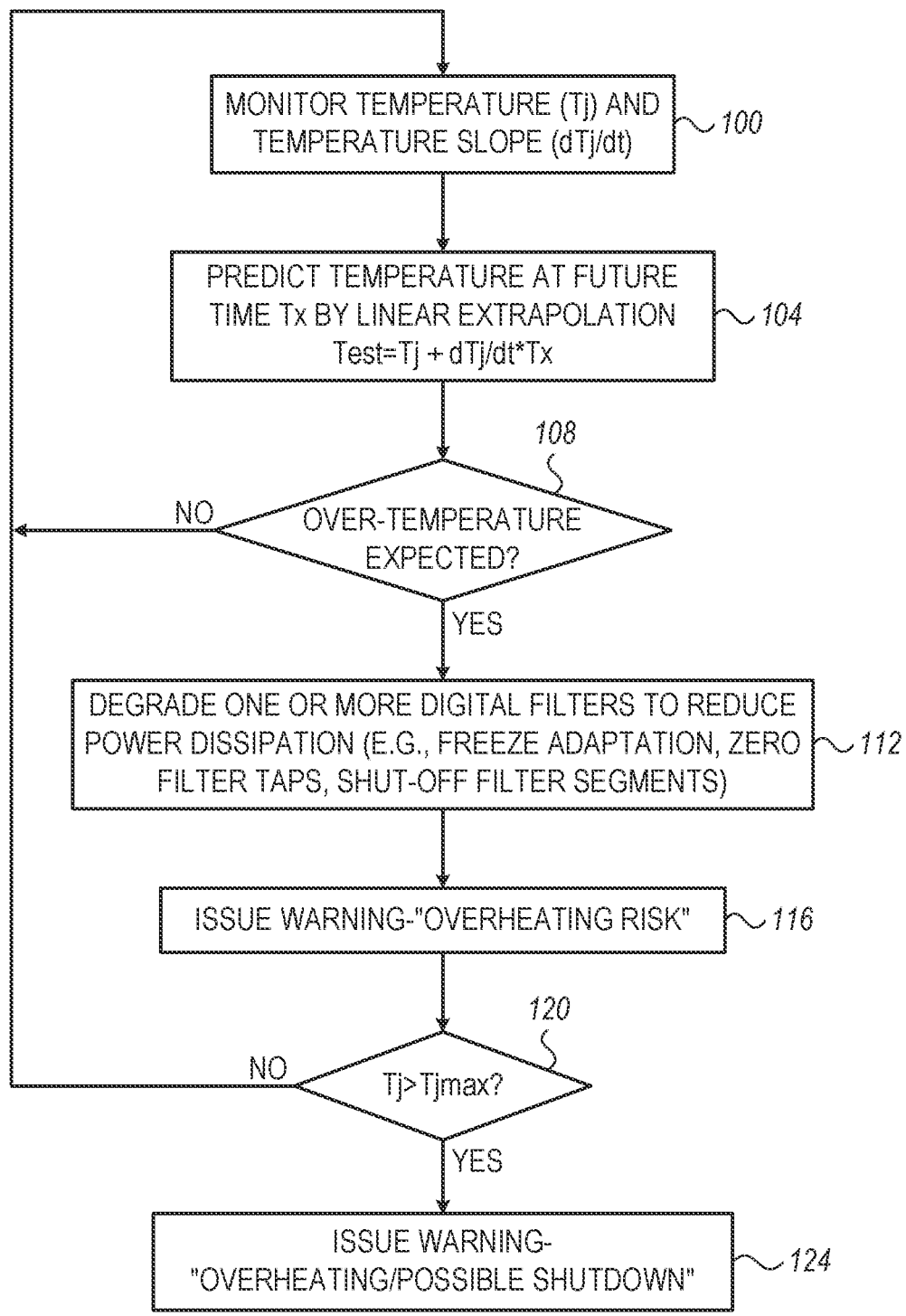
FIGS. 2 and 3 are flow charts that schematically illustrate methods for mitigating over-temperature conditions in a PHY transceiver of the system of FIG. 1, by degrading functionality of one or more digital filters, in accordance with embodiments that are described herein.

FIG. 2 is a flow chart that schematically illustrates a method for mitigating over-temperature conditions in PHY transceiver 36, in accordance with an embodiment that is described herein. The method begins with controller 88 monitoring a junction temperature (denoted Tj) and a junction-temperature (the variation in temperature as a function of time, denoted dTj/dt), at a monitoring stage 100.

The junction temperature being monitored may be the junction temperature of a certain semiconductor device in PHY transceiver 36, or of PHY transceiver 36 as a whole. Controller 88 monitors the temperature and temperature slope, in an embodiment) by reading temperature sensor 92 (FIG. 1) at multiple points in time.

Although the junction temperature is the temperature that affects reliability and availability, in practice it is usually infeasible to measure junction temperatures directly, Typically, the temperature being measured by sensor 92 is a case temperature or an ambient temperature, which is correlative to the junction temperature. In the present context, terms such as "temperature", "temperature slope", "over-temperature condition", etc. may refer to junction temperature, case temperature, ambient temperature, or any other suitable temperature that is correlative to reliability and availability of the PHY transceiver. In other words, the reliability and availability of the PHY transceiver vary as a function of any of the above-listed temperatures, and therefore any of these temperatures can be used in the disclosed techniques.

At a prediction stage 104, controller 88 estimates a predicted junction temperature (denoted Test) for a future time (denoted Tx), based on the measured temperature and temperature slope. In an embodiment, controller 88 estimates the predicted temperature by linear extrapolation, e.g., by calculating Test=Tj+dTj/dt*Tx. In alternative embodiments, any other suitable prediction scheme can be used.

At a predicted over-temperature checking stage 108, controller 88 whether checks the predicted temperature (Test) indicates that over-temperature is expected to occur at time Tx. In an example embodiment controller 88 checks whether Test>Tjmax, wherein Tjmax denotes a predefined temperature threshold set for the junction temperature. Tjmax in this context is also referred to as an "overheating threshold".

If over-temperature is not expected to occur at future time Tx, the method loops back to stage 100 above. If over-temperature is predicted to occur at future time Tx, controller 88 proceeds to degrade the functionality of one or more of the digital filters in PHY transceiver 36, at a degrading stage 112. Controller 88 may use any of the above-described techniques and/or sequences of operations.

At an over-temperature warning stage 116, controller 88 issues a "overheating risk" warning, e.g., to the host system, indicating that over-temperature is predicted to occur. Additionally or alternatively, controller 88 may issue a notification, e.g., to the host that system, indicating the performance of PHY transceiver 36 been has degraded. In various embodiments, the host system in the vehicle may react to such notifications in various ways. For example, the host system may give a lower weight or a lower confidence level to a sensor whose communication link in reported as having degraded performance.

At an actual over-temperature checking stage 120, controller 88 checks whether over-temperature actually occurs following degradation of digital filter functionality. Controller 88 may check, for example, whether Tj>Tjmax (both defined above). Here, too, Tjmax serves as an overheating threshold. Controller 88 may wait a certain time period before performing this stage, to allow the degradation in filter functionality to affect the measured temperature.

If no over-temperature is occurs, the method loops back to stage 100 above. If over-temperature is detected, controller 88 concludes that the degradation in digital filter functionality did not resolve the over-temperature condition. Controller 88 thus issues an "overheating/possible shutdown" warning, e.g., to the host system, at a shutdown warning stage 124. The controller may shutdown PHY device 36 at this stage to avoid damage.

Figure 3:
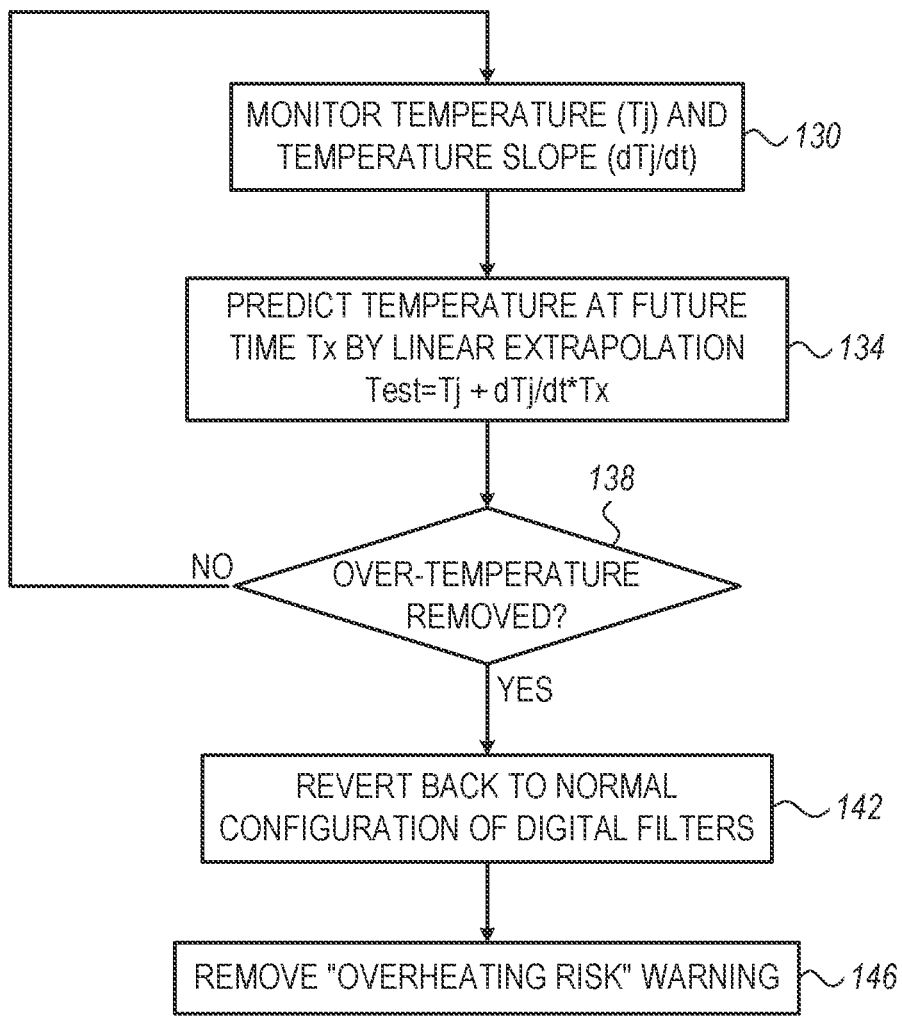

FIG. 3 is a flow chart that schematically illustrates a method for reverting back from an over-temperature condition to normal operation conditions in PHY transceiver 36, in accordance with an embodiment that is described herein. The method of FIG. 3 is carried out by controller 88 while a over-temperature condition is predicted, and one or more digital filters have been degraded to try and avoid actual over-temperature. The objective of this method is to revert back to the normal digital filter configuration, if possible.

The method begins with controller 88 monitoring the junction temperature (Tj) and the junction-temperature slope (dTj/dt), at a monitoring stage 130. At a prediction stage 134, controller 88 estimates the predicted junction temperature (Test) for a future time (Tx), based on the measured temperature and a history of measured temperatures or temperature slope.

At an over-temperature removal checking stage 138, controller 88 checks whether over-temperature is still predicted to occur at time Tx or not. For example, controller 88 may check whether Test<Tj. This condition is also referred to as a "temperature-renormalization" condition. Alternatively, any other suitable condition can be used. If the prediction of over-temperature is still in effect, the method loops back to stage 130 above. If over-temperature longer predicted, controller 88 reverts any digital filter that is operating in a degraded configuration back to normal configuration, at a reverting stage 142. Controller 88 removes the "overheating risk" warning, at a warning removal stage 146.

The methods depicted FIGS. 2 and 3 are example methods that are chosen solely for the sake of conceptual clarity. In alternative embodiments, controller 88 may use any other suitable method for detecting actual or predicted over-temperature conditions, and for detecting that such conditions are no longer in effect.

For example, in some embodiments controller 88 may use a pre-trained Machine Learning (ML) model for predicting over-temperature conditions. Such a ML model would typically be applied to one or more measured and/or predicted temperatures. More generally, controller 88 may use a history of temperature conditions, in any suitable way, to detect or predict that the temperature exceeds or will exceed a temperature threshold.

Although the embodiments described herein mainly address PHY transceivers in automotive networks, the methods and systems described herein can also be used in other devices that comprise digital filters and require high availability under harsh temperature conditions. For example, high-speed Ethernet (Base-T) PHY transceivers often comprise multiple long echo cancelers and NEXT/FEXT cancelers that draw considerable power and contribute considerable heat. The disclosed techniques can therefore be highly beneficial is such devices.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A Physical Layer (PHY) transceiver, comprising:
communication circuitry comprising a digital filter, the communication circuitry configured to communicate signals, using the digital filter, over a network link; and
a controller configured to monitor a temperature pertaining to the communication circuitry, and, in response to detecting an actual or predicted over-temperature condition, to degrade a functionality of the digital filter so as to reduce power dissipation in the communication circuitry.

2. The PHY transceiver according to claim 1, wherein the digital filter is adaptive, and wherein the controller is configured to degrade the functionality by freezing or slowing-down adaptation of the digital filter.

3. The PHY transceiver according to claim 1, wherein the digital filter comprises a plurality of taps, and wherein the controller is configured to degrade the functionality by zeroing one or more of the taps.

4. The PHY transceiver according to claim 1, wherein the digital filter is divided into two or more filter segments, and wherein the controller is configured to degrade the functionality by deactivating one or more of the filter segments.

5. The PHY transceiver according to claim 1, wherein the controller is further configured to reduce the power dissipation by reducing a clock speed of at least part of the communication circuitry.

6. The PHY transceiver according to claim 1, wherein the communication circuitry further comprises an Error Correction Code (ECC) decoder, and wherein the controller is further configured to reduce the power dissipation by degrading the functionality of the ECC decoder.

7. The PHY transceiver according to claim 1, wherein the communication circuitry further comprises an analog front end (AFE), and wherein the controller is further configured to reduce the power dissipation by limiting a power provided to the AFE.

8. The PHY transceiver according to claim 1, wherein the controller is configured to detect an actual or predicted over-temperature condition, by detecting that the monitored temperature exceeds or is expected to exceed a temperature threshold.

9. The PHY transceiver according to claim 1, wherein the controller is configured to detect the actual or predicted over-temperature condition, by detecting that the monitored temperature exceeds or will exceed a temperature threshold at a future point in time.

10. The PHY transceiver according to claim 1, wherein the controller is configured to detect the predicted over-temperature condition by:
calculating a slope of the temperature; and
predicting, based on the monitored temperature and the calculated temperature slope, that the over-temperature condition will occur at a future point in time.

11. The PHY transceiver according to claim 1, wherein the controller is configured to detect the predicted over-temperature condition, by:
monitoring the temperature at a plurality of points in time; and
predicting that the temperature will exceed a temperature threshold at a future point in time.

12. The PHY transceiver according to claim 1, wherein the controller is configured to detect the predicted over-temperature condition by applying a Machine Learning (ML) model at least to the monitored temperature.

13. The PHY transceiver according to claim 1, wherein the controller is configured to detect the actual or predicted over-temperature condition, by evaluating that an overheating threshold has been exceeded or forecasting, based on a history of temperature measurements, that an overheating threshold will be exceeded.

14. The PHY transceiver according to claim 1, wherein the controller is configured to revert back to normal functionality of the digital filter upon detecting that the communication circuitry meets a temperature-renormalization condition.

15. The PHY transceiver according to claim 1, wherein, in response to violation of the over-temperature condition, the controller is configured to issue a warning indicating that the functionality of the digital filter is degraded.

16. The PHY transceiver according to claim 1, wherein the PHY transceiver is part of a communication network in a vehicle, and wherein the controller is configured to degrade the functionality based on an expected impact of the degraded functionality on safety of the vehicle.

17. A method for operating a Physical Layer (PHY) transceiver that includes a digital filter, the method comprising:
communicating signals using the digital filter over a network link;
monitoring a temperature pertaining to the PHY transceiver; and
in response to detecting an actual or predicted over-temperature condition, degrading a functionality of the digital filter so as to reduce power dissipation in the PHY transceiver.

18. The method according to claim 17, wherein degrading the functionality comprises one or more of;
freezing or slowing-down adaptation of the digital filter;
zeroing one or more taps of the digital filter; and
deactivating one or more of filter segments of the digital filter.

19. The method according to claim 17, wherein degrading the functionality comprises one or more of;
reducing a clock speed of at least part of the PHY transceiver;
degrading the functionality of an Error Correction Code (ECC) decoder in the PHY transceiver; and
limiting a power provided to an analog front end (AFE) in the PHY transceiver.

20. The method according to claim 17, wherein the PHY transceiver is part of a communication network in a vehicle, and wherein degrading the functionality is performed based on an expected impact of the degraded functionality on safety of the vehicle.

* * * * *